United States Patent
Liu et al.

(10) Patent No.: US 8,929,134 B2
(45) Date of Patent: Jan. 6, 2015

(54) METHOD OF PROGRAMMING A FLASH MEMORY BY ENHANCING THE CHANNEL VOLTAGE OF A PROGRAM-INHIBIT BIT LINE WITH A BOOSTED INHIBIT SCHEME

(71) Applicant: Macronix International Co., Ltd., Hsin-Chu (TW)

(72) Inventors: Chu Yung Liu, Changhua County (TW); Hsing Wen Chang, Miaoli County (TW); Yao Wen Chang, Hsinchu County (TW); Tao Cheng Lu, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 100 days.

(21) Appl. No.: 13/762,896

(22) Filed: Feb. 8, 2013

(65) Prior Publication Data

US 2014/0226411 A1     Aug. 14, 2014

(51) Int. Cl.
*G11C 16/10*     (2006.01)
(52) U.S. Cl.
CPC ...................................... *G11C 16/10* (2013.01)
USPC ............ 365/185.02; 365/185.17; 365/185.19; 365/185.33

(58) Field of Classification Search
USPC ............. 365/185.02, 185.17, 185.19, 185.18, 365/185.33
See application file for complete search history.

(56) References Cited

U.S. PATENT DOCUMENTS 6,282,122 B1 * 8/2001 Sansbury ................. 365/185.24
8,289,775 B2 * 10/2012 Lee et al. ................. 365/185.18
8,406,048 B2 * 3/2013 Yang et al. ............... 365/185.02

* cited by examiner

*Primary Examiner* — Andrew Q Tran
(74) *Attorney, Agent, or Firm* — WPAT, PC; Justin King

(57) ABSTRACT

A method of programming a NAND flash memory cell string. The method includes a pre-boost stage configured to elevate channel voltage of a selected memory cell, and a boost stage is introduced after the pre-boost stage. The pre-boost stage has at least the following steps of biasing a bit line to a first voltage, biasing a string select transistor to a second voltage; and ramping down the string select transistor to the first voltage. In particular, the second voltage is higher than the first voltage.

20 Claims, 11 Drawing Sheets

METHOD OF PROGRAMMING A FLASH MEMORY BY ENHANCING THE CHANNEL VOLTAGE OF A PROGRAM-INHIBIT BIT LINE WITH A BOOSTED INHIBIT SCHEME

FIELD OF THE INVENTION

The present invention relates in general to a method of programming a non-volatile memory, especially, for a flash memory.

BACKGROUND

FIG. 1 is a circuit schematic of a typical NAND Flash memory cell string used in memory cell array. The cell string has a bit line BL connected with a string select transistor 12, wherein the gate of the string select transistor 12 is connected to a string select line, SSL. The cell string also includes a plurality of serially connected floating gate memory cells 16 each connected to respective wordlines $WL_0$ to $WL_n$, and a ground select transistor 14 connected to a ground select line, GSL. The GSL transistor 14 is disposed between the common source line 18 and the last floating gate memory cell 16. When erased, the memory cell will have a negative threshold and be set to a default logic state, such as logic "1", for example. When written, another way called programmed, the memory cell will have its threshold voltage changed to positive, thus representing the opposite "0" logic state. The stored logic state of a memory cell might be changed unintentionally while programming other cells on the same wordline. Generally, a program inhibit scheme is used to reduce the disturbance to a non-programmed memory cell 16 on a biased wordline but an effective solution is still not seen.

SUMMARY OF THE INVENTION

It is the object of the present invention to provide a program scheme to have a pre-boost stage that elevates channel voltage of a selected cell on an inhibit bit line. More particularly, the gate of the selected cell is electrically coupled to a to-be-driven selected worldline that is configured to program some other cell(s) on the same wordline. Moreover, the program scheme is to inhibit the selected cell by increasing the channel potential of the selected cell while the wordline is driven by a bias at a boost stage, such that the potential difference between the selected cell's gate and its channel is reduced.

In some embodiments, the pre-boost stage is arranged prior to biasing the selected cell during a boost stage. The pre-boost stage includes a step to bias the inhibit bit line to a first level, of $V_{BL}$ for example. Then the gate of the string select transistor is biased to a second level, of $V_{SSL}$, wherein the second level $V_{SSL}$ is higher than the first level $V_{BL}$. The pre-boost stage further includes ramping down the string select transistor before applying a program voltage on a selected wordline. The string select transistor can be ramped down to the first level. In some embodiments, the difference between the second level and the first level is greater than the threshold voltage of string select transistor.

In some embodiments, the pre-boost stage includes a step to bias the inhibit bit line to a first level voltage. Then the gate of the string select transistor is biased to a second level voltage, wherein the second level voltage is higher than the first level voltage. The difference between the second level and the first level is greater than the threshold voltage of string select transistor in order to turn on the transistor. Concurrently with ramping up the string select transistor, the unselected wordlines and the selected wordline are driven to a pass voltage. Then the pre-boost stage further has a step of ramping down the string select transistor and cells coupled to the wordlines before programming. The string select transistor can be ramped down to the first level.

In yet another aspect, the present invention provides a method for elevating channel voltage of a selected memory cell in a Flash memory string. The string can have the selected memory cell which is to be inhibited, upper memory cells between the selected memory cell and the string select transistor, and lower memory cells between the selected memory cell and the ground select line. The method has a pre-boost stage that elevates channel voltage of the selected cell. The pre-boost stage includes a step to bias the inhibit bit line to a first level. Then the gate of string select transistor is biased to a second level, wherein the second level is higher than the first level. The difference between the second level and the first level is greater than the threshold voltage of string select transistor. Optionally, the lower memory cells are driven to a pass voltage concurrently with ramping up the string select transistor. The pre-boost stage further has a step of consecutively ramping down the lower memory cells to a low or 0V before entering the boost stage. In some embodiments, the lower cells are ramped down in an order which is from the bottom cell which is nearest to the ground select line to the one next to the selected memory cell.

In some embodiments, the pre-boost stage further has a step to lower the bias on the string select transistor to the first level after ramping down the lower memory cells to a low state.

BRIEF DESCRIPTION OF THE DRAWINGS

The invention will be described according to the appended drawings in which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a,"

"an," and "the" include plural references. The term "coupled" implies that the elements may be directly connected together or may be coupled through one or more intervening elements.

The present invention provides a method for enhancing the channel voltage of the program inhibit bit line with a boosted inhibit scheme. This allows channel of a selected cell to be elevated at a pre-boost stage to a voltage level sufficient for preventing the cell from undesired disturbance, such as programming, when the corresponding wordline is raised to a programming voltage at a boost stage. A pre-boost stage is included in the method to ensure the selected cell to have a higher pre-boost and boost channel voltage.

Figure 1:
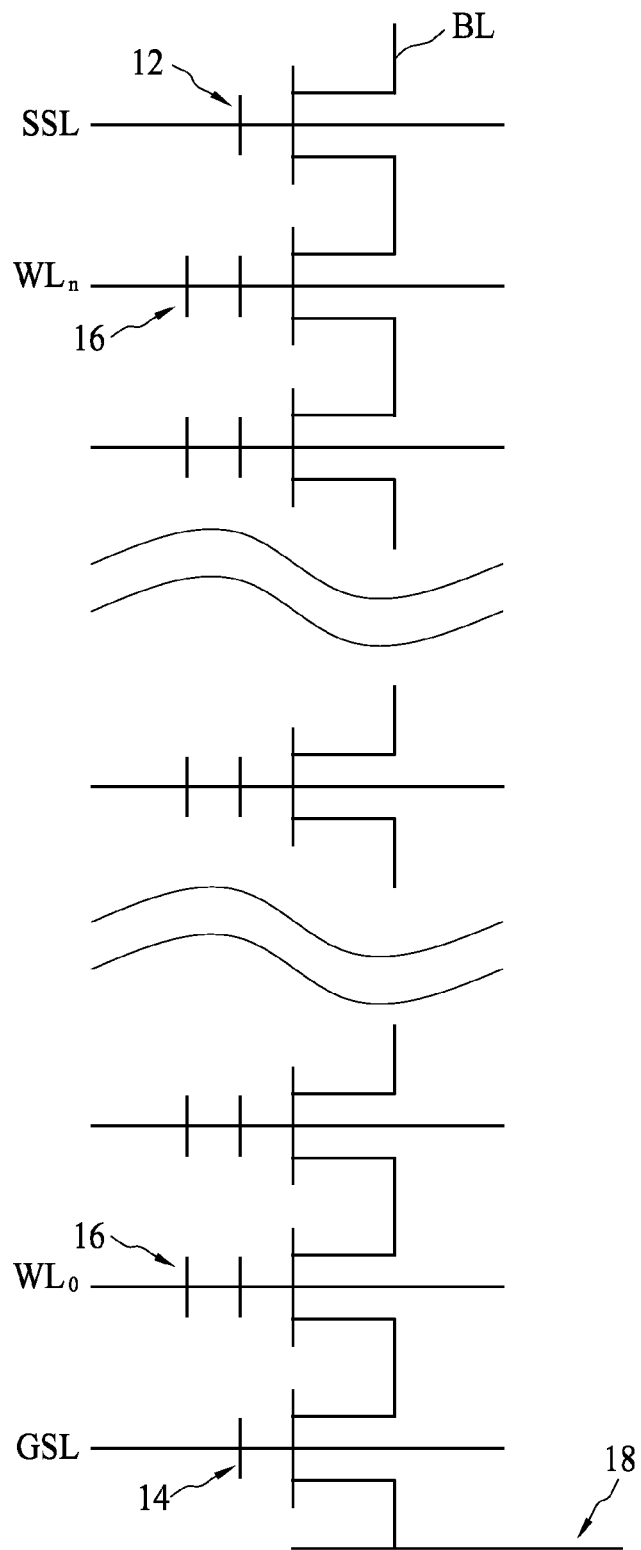
FIG. 1 is a circuit schematic of a typical NAND Flash memory cell sting.
Figure 2:
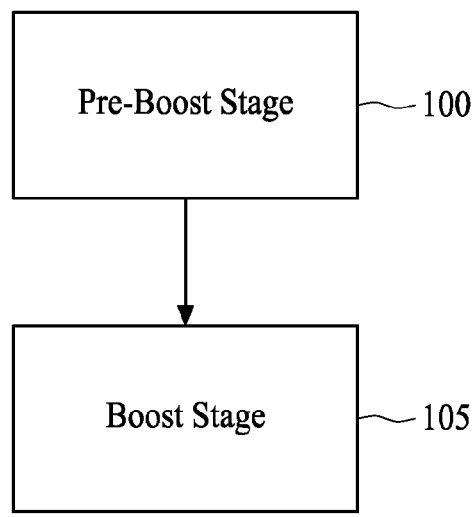
FIG. 2 is a flow chart of a method according to one embodiment.

FIG. 2 is a flow chart illustrating a program inhibit method according to one embodiment of the present disclosure. A pre-boost stage is introduced to a selected memory cell with gate electrically coupled to a selected wordline at step 100. Then at step 105, a programming voltage is applied on the selected wordline at a boost stage.

Figure 3:
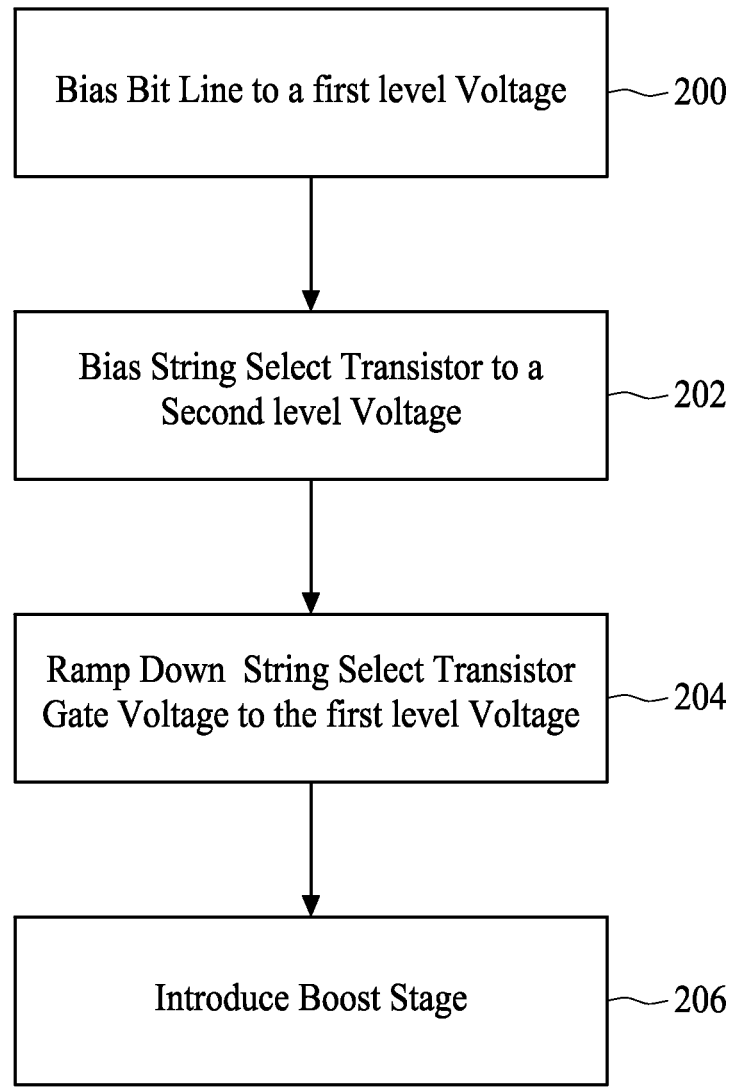
FIG. 3 is a flow chart of a method according to one embodiment.
Figure 4:
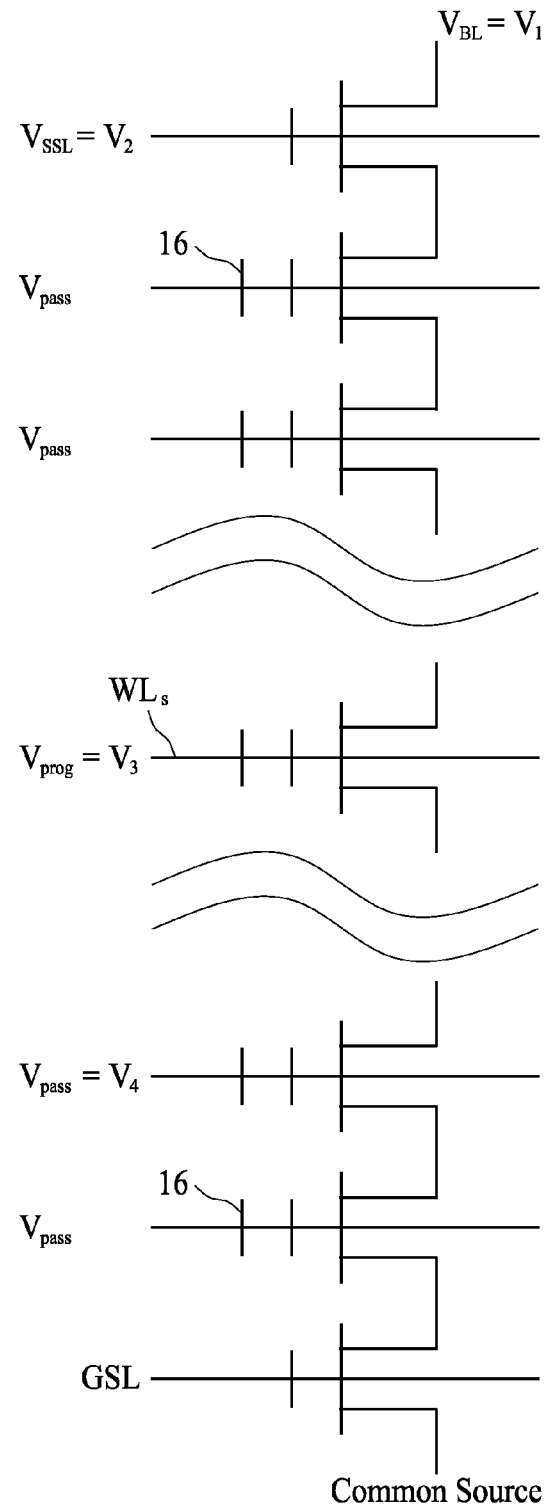
FIG. 4 is a circuit schematic of one embodiment.

FIG. 3 is a flow chart illustrating a program inhibit method according to one embodiment of the present disclosure and FIG. 4 is circuit schematic of a NAND Flash memory cell string programmed by the method. An inhibit bit line is biased to a first level voltage, $V_{BL}=V_1$ at step 200. In general, $V_1$ can be $V_{cc}$. Then at step 202, gate of the string select transistor is biased to a second level, $V_{SSL}=V_2$, which is higher than $V_{BL}$. Usually, the second voltage level is greater than the value of $V_{BL}$ plus the threshold voltage of the string select transistor, $V_{SSL\_th}$, i.e. $V_{SSL}>V_{BL}+V_{SSL\_th}$. Since the voltage difference between the gate and the drain is greater than threshold voltage, the string select transistor is turned on to boost the channel voltage of the bit line. Gate voltage of the string select transistor is ramped down from the second voltage level $V_2$ to the first voltage level $V_1$ at step 204 to accordingly turn the transistor off and keeps all the memory cells on the bit line floated. At step 206, a boost stage is introduced to drive the selected wordline $WL_s$ to a programming voltage, $V_{prog}=V_3$, while biasing other wordlines to a pass voltage, $V_{pass}=V_4$. The programming voltage $V_3$ is high enough to program an uninhibited memory cell located on the selected wordline and the pass voltage $V_4$ for each cell can be different as long as it is high enough to turn on each unselected memory cell. The following relational expressions can be used in the embodiment of FIG. 4.

$$0<V_1<V_2$$

$$V_{th}<V_4<V_3$$

Figure 5A:
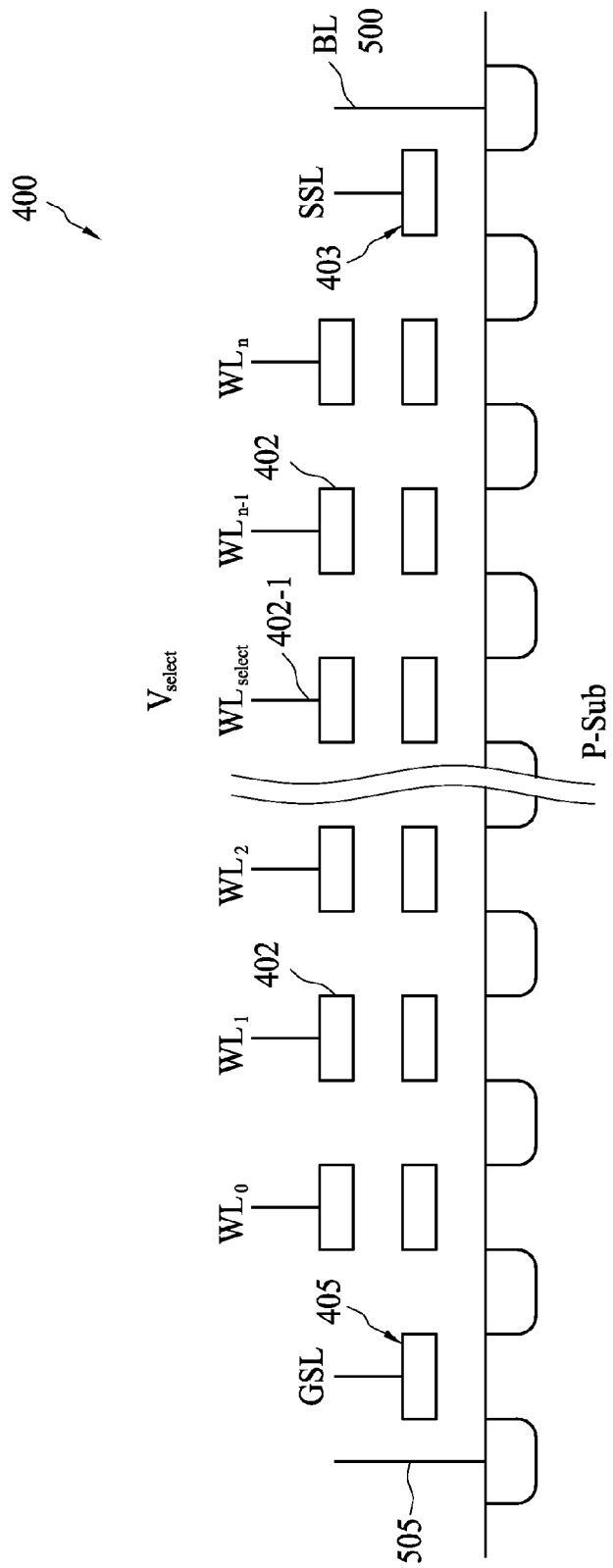
FIG. 5A is a cross-sectional view of a simplified NAND string of one embodiment.
Figure 5B:
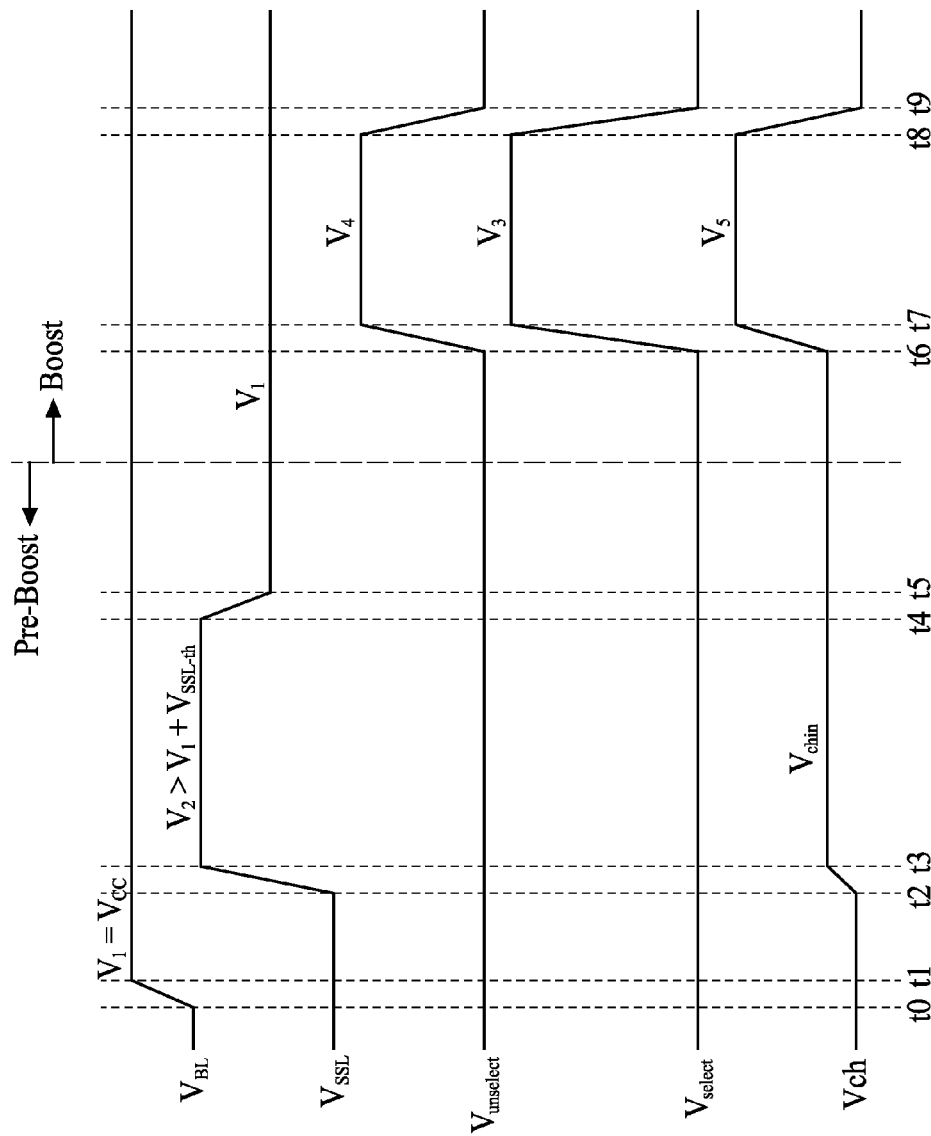
FIG. 5B is a sequence diagram of one embodiment.

FIG. 5A is a simplified cross sectional view of a NAND string 400. FIG. 5B is a sequence diagram further illustrating the sequence of the voltages being applied in FIG. 5A. NAND string 400 includes memory cells 402 having gates connected to wordlines $WL_0$ to $WL_n$, a string select transistor 403 for coupling the NAND string 400 to a bit line 500, and a ground select transistor 405 for coupling the NAND string 400 to a source line 505. The NAND string is formed in a p-substrate. The source/drain regions of the NAND string memory cells are n-type diffusion regions.

At time $t_0$, bit line 500 starts ramping up and reaches a first voltage $V_1$ at time $t_1$. The bit line voltage maintains at $V_1$, which can be $V_{cc}$ in this embodiment. At $t_2$, the string select transistor 403 is biased and ramping up. The string select transistor voltage, $V_{SSL}$, reaches a second voltage level $V_2$ at time $t_3$, wherein the second voltage is greater than $V_1+V_{SSL\_th}$. At time $t_4$, the string select transistor voltage starts ramping down from $V_2$ and reaches the first voltage level $V_1$ at time $t_5$. Between time $t_5$ and $t_6$, a boost stage is phased in, whereby at time $t_6$, gate of the selected cell 402-1 is biased by applying a voltage to the selected wordline $WL_{select}$ until the gate voltage reaches $V_{select}=V_{prog}=V_3$ at time $t_7$. Concurrently, each unselected memory cell is also biased by applying a voltage to its respective wordline at time $t_6$ until each gate reaches pass voltage, $V_{unselect}=V_{pass}=V_4$, time $t_7$. At time $t_8$, all memory cells (including selected and unselected cells) start ramping down. In some particular embodiments as shown in FIG. 5B, at time $t_9$, both $V_{select}$ and $V_{unselect}$ are ramped down to the voltage as at the pre-boost stage. $V_{ch}$ in FIG. 5B represents the potential in the channel of the selected memory cell 402-1. At time $t_2$, when the voltage of the string select transistor 403 is ramping up, $V_{ch}$ is also charged up simultaneously by the bit line voltage $V_{BL}$ to a pre-boost level $V_{chin}$ at time $t_3$. The channel voltage holds steady at $V_{chin}$ and will be elevated to $V_5$ at time $t_6$ by the ramping-up voltage applied on the selected and non-selected wordlines. The channel potential $V_{ch}$ at the boost stage according to one embodiment is calculated according to equation (1) below:

$$Vch = Vchin + (Vpass - Vth) \times N - 1/N \times \alpha + Vprog \times 1/N \times \beta \qquad (1)$$

where $V_{chin}$ is the channel potential at the pre-boost stage, $V_{pass}$ is the bias applied on the unselected memory cell, $V_{th}$ is the threshold voltage of is the unselected memory cell, $V_{prog}$ is the programming voltage applied on the selected wordline $WL_{select}$, N is the total number of memory cells in the memory string 400, $\alpha$ and $\beta$ respectively represents a different factor.

Figure 6:
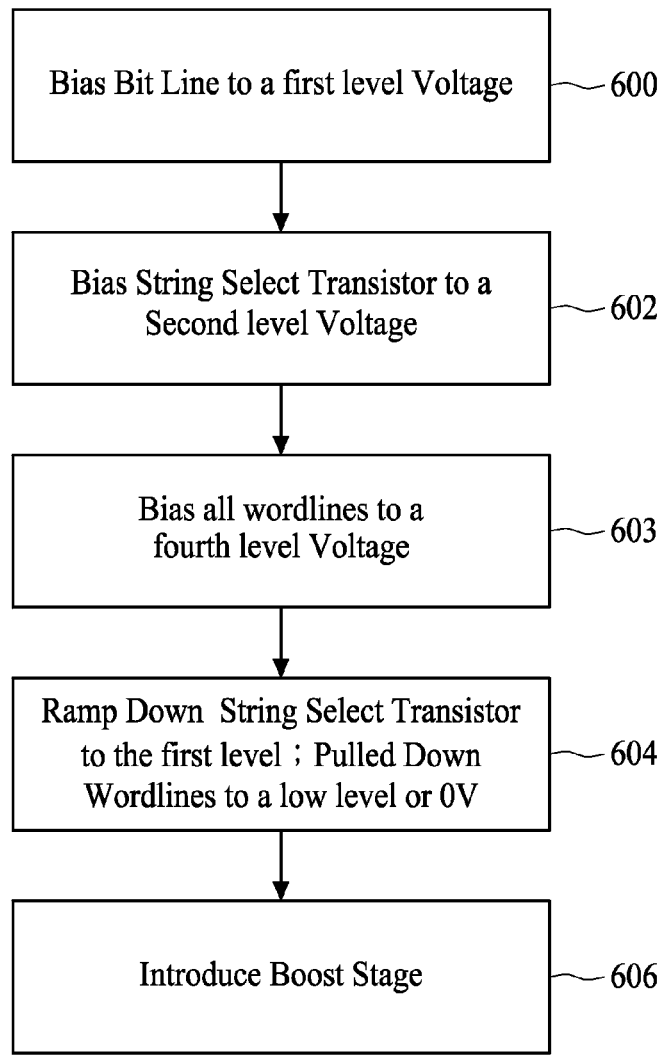
FIG. 6 is a flow chart of a method according to one embodiment.
Figure 7:
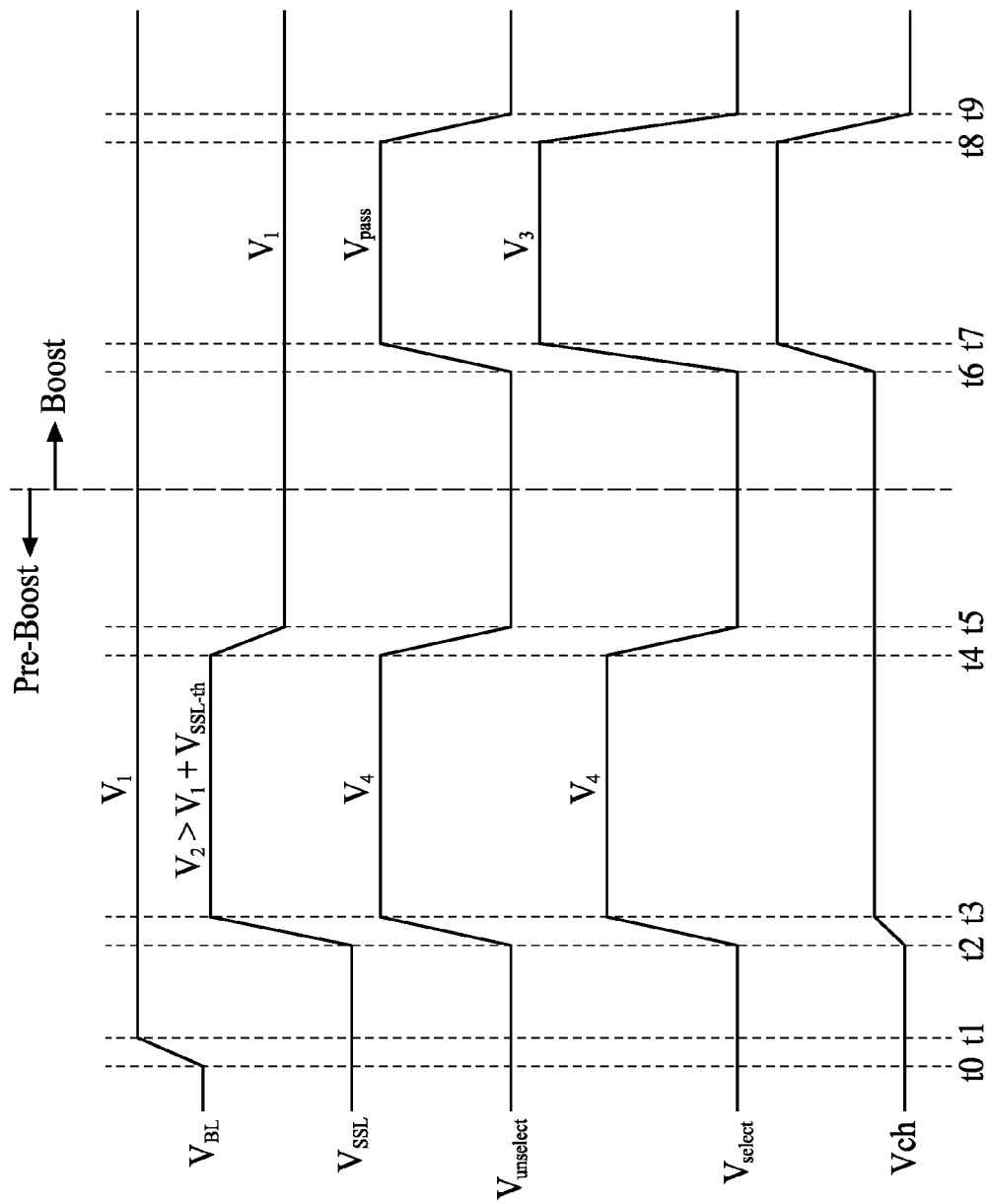
FIG. 7 is a sequence diagram of one embodiment.

FIG. 6 is a flow chart illustrating a program inhibit method according to one embodiment of the present disclosure and FIG. 7 is a diagram illustrating a sequence applied on a NAND memory string according to the embodiment. The inhibit bit line is biased to a first voltage, $V_{BL}=V_1$, at step 600. In general, $V_1$ can be $V_{cc}$. Then at step 602, gate of the string select transistor is biased to a second level, $V_{SSL}=V_2$, which is higher than $V_1$. Usually, the second voltage level is greater than $V_{BL}$ plus the threshold voltage of the string select transistor, $V_{SSL\_th}$, i.e. $V_{SSL}>V_{BL}+V_{SSL\_th}$. Since the voltage difference between the gate and the drain is greater than the threshold voltage, the string select transistor is turned on to elevate the channel voltage of the bit line. Concurrently or separately, at step 603 all wordlines are driven to ramp up all memory cells to a fourth voltage, $V_{pass}=V_4$, while the string select transistor is turned on, wherein the fourth voltage is configured to help charge up the channel potential. In the present embodiment, $V_4$ is lower than the programming voltage, $V_{prog}$ of the memory cell but higher than $V_{cc}$. In some embodiments, step 603 can be arranged before step 602.

At step 604, the bias on the string select transistor is ramped down to the first level voltage and gate voltage on the memory cells is pulled down to a low level or 0V. In some embodiments, the low level is the initial level, which is the gate voltage of memory cells before step 602. At step 606, a boost stage is introduced to bias the selected wordline to a programming voltage, $V_{prog}=V_3$, while biasing other wordlines to a pass voltage, $V_{pass}$. The programming voltage is high enough to program an uninhibited memory cell located on the selected wordline and the pass voltage is high enough to turn on each unselected memory cell in order to get the channel voltage boosted.

Referring to FIG. 5A and FIG. 7, at time $t_0$, bit line 500 starts ramping up and reaches the first voltage $V_1$ at time $t_1$. The bit line voltage $V_{BL}$ maintains at $V_1$. At time $t_2$, the string select transistor 403 is biased and ramping up. The string select transistor voltage, $V_{SSL}$, reaches a second voltage level $V_2$ at time $t_3$, wherein the second voltage is greater than $V_1+V_{SSL\_th}$. Wordlines connected to the unselected memory cells 402 and the wordline connected to the gate of the selected memory cell 402-1 are also biased at $t_2$ and voltages of all wordlines are elevated to a fourth voltage $V_4$ at $t_3$. At time $t_4$, the string select transistor voltage starts ramping down and lower to the first voltage level $V_1$, which is same with $V_{BL}$ at time $t_5$. Simultaneously, the voltage on each memory cell is ramped down to a low level or 0V, which may be the initial voltage of each cell before it is ramped up at time $t_2$. A boost stage, which is the same as shown in FIG. 5B is introduced after time $t_5$.

Various program inhibit sequences according to embodiments of the present invention can be realized by changing the voltages, time, interval in the embodiments.

Figure 8:
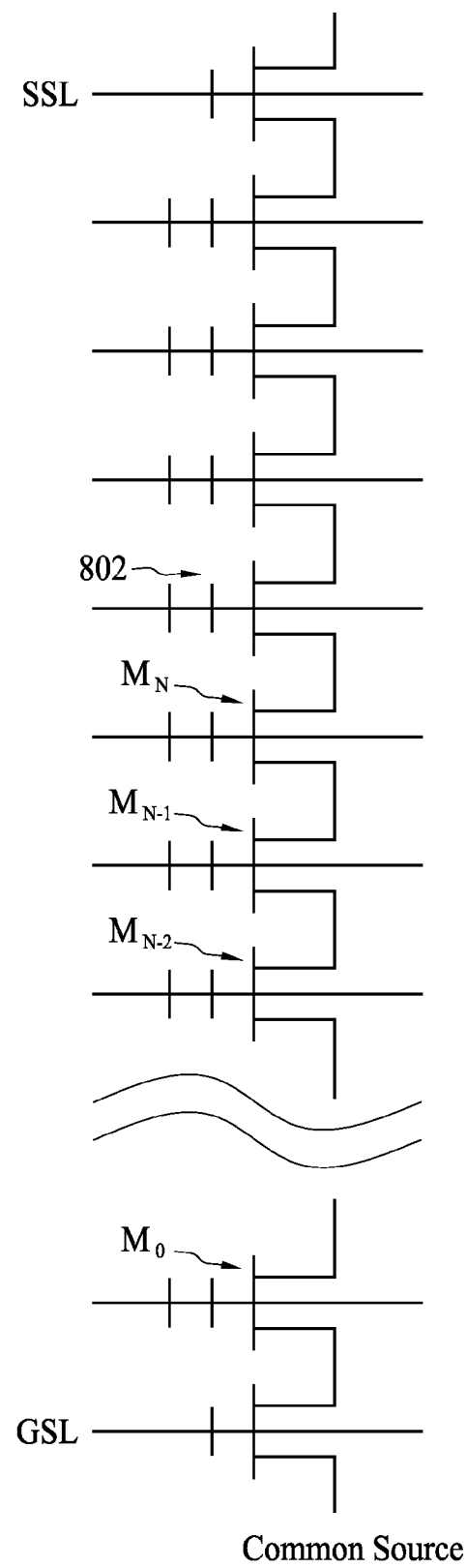
FIG. 8 is a circuit schematic of one embodiment.
Figure 9:
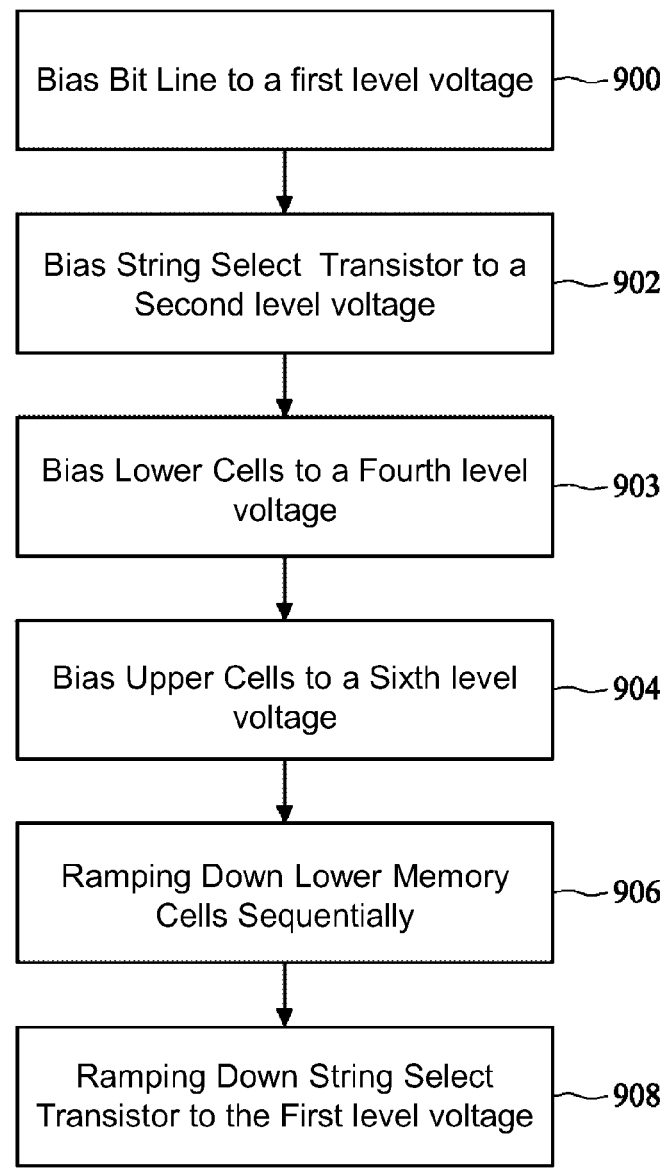
FIG. 9 is a flow chart of a method according to one embodiment.

FIG. 8 is circuit schematic of a NAND Flash memory cell string. The string can have a selected memory cell 802 which is to be inhibited. In the present embodiment, there are N+1 lower memory cells ($M_0 \sim M_N$) between the selected cell 802 and the ground select line, GSL, and upper memory cells between the selected cell 802 and the string select line, SSL. The lower cell is located further from the string select transistor than the selected memory cell, and the upper cell is located nearer to the string select transistor than the selected memory cell. A method embodiment according to the present disclosure is shown in the flow chart of FIG. 9. The inhibit bit line is biased to a first voltage $V_1$ at step 900. In general, $V_1$ can be $V_{cc}$. At step 902, gate of the string select transistor is biased to a second level $V_2$, which is higher than $V_1$. Usually, the second voltage level $V_2$ is greater than $V_1$ plus the threshold voltage of the string select transistor, $V_{SSL\_th}$, i.e. $V_2 > V_1 + V_{SSL\_th}$. At step 903, wordlines connected to the lower memory cells are driven to ramp up the lower memory cells to a fourth voltage $V_4$. At step 904, wordlines connected to the upper memory cells are driven to ramp up the memory cells to a sixth voltage $V_6$. At step 906, the lower memory cells start ramping down sequentially in an order which is from bottom to top. The memory cell which is most near the GSL firstly starts ramping down to a low state, then in an order that ends at the one next to the selected memory cell 802. At step 908, the voltage on the gate of the string select transistor is ramped down to $V_1$. It should be noted here that step 900-904 can be arranged in different orders as desired.

Figure 10:
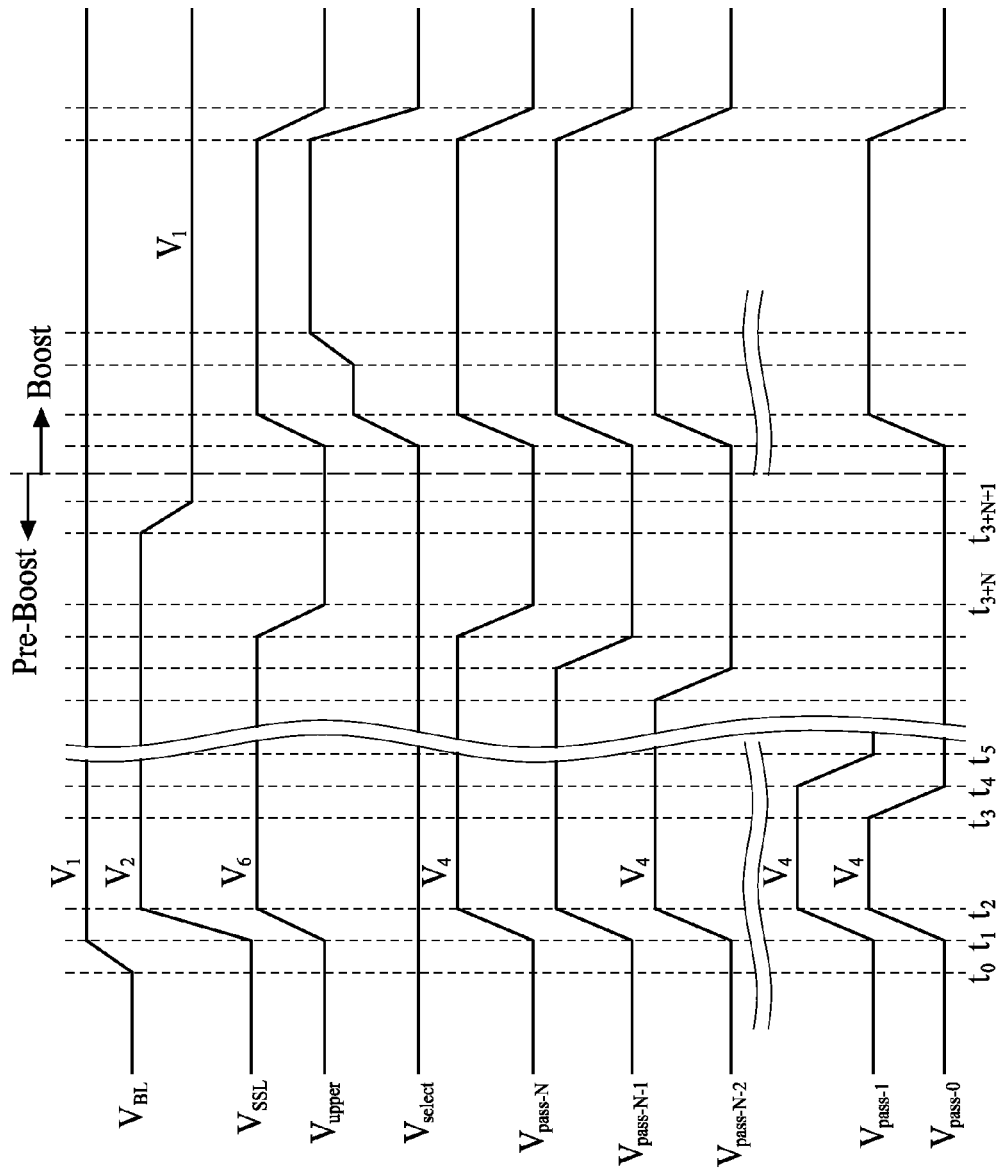
FIG. 10 is a sequence diagram of one embodiment.

FIG. 10 is a sequence diagram further illustrating the sequence being applied in FIG. 8 according to one embodiment. At time $t_0$, bit line 500 starts ramping up and at time $t_1$ the bit line voltage reaches the first voltage $V_1$. The bit line voltage maintains at the first voltage. At time $t_1$, the string select transistor is biased and the gate voltage is ramping up. The string select transistor voltage, $V_{SSL}$, reaches a second voltage level $V_2$ at time $t_2$, wherein the second voltage is greater than $V_{cc} + V_{th\_SSL}$. Wordlines connected to the upper and lower memory cells can be optionally biased at $t_2$ and voltages of all wordlines, $V_{pass}$, are elevated to a fourth or a sixth voltage, $V_4$ or $V_6$. Wherein $V_4$ can be the same or different from $V_6$, moreover, gate of each lower memory cell may be biased with a same or different pass voltage $V_{pass\_x}$, where X=0~N. Each memory cell's pass voltage should be high enough to ensure that the channel underneath of each cell is made to be conductive. Gate of each upper memory cell is also biased with a same $V_{pass\_x}$ or different pass voltage $V_{pass\_norm}$ from $V_{pass\_x}$. In general, the $V_{pass\_norm}$ of each upper memory cell should be high enough to ensure that the channel underneath of each cell is made to be conductive. Alternatively, the pass voltage can be applied to the unselected memory cells before the bit line BL or the string select transistor is biased. The selected wordline coupled to the gate of the selected memory cell 802 and the wordline coupled to the upper memory cell can be optionally biased at the pre-boost stage.

After $t_2$, at time $t_3$, the most bottom memory cell biased with $V_{pass\_0}$ starts ramping down its gate voltage and reaches a low state at $t_4$, which may be the initial value before pass voltage applied. At time $t_5$, the memory cell right above the most bottom one biased with $V_{pass\_1}$ starts ramping down its gate voltage to low state. Consecutively, the lower memory cells ramps down in an order which starts from $t_3$ of the bottom memory cell ($M_0$) to $t_{3+N}$ of the $N_{th}$ memory cell ($M_N$). At time $t_{3+N+1}$, the string select transistor voltage, $V_{SSL}$ is pulled down to reach a lower level which may be the first voltage level. A boost stage is introduced after time $t_{3+N+1}$ in order to program the selected wordline electrically coupled to the gate of the selected memory cell 802. The present program scheme is also advantageous for preventing back pattern effect if there is any programmed cell, $M_N$ for example, below the selected cell 802. The programmed cell $M_N$ usually has a higher threshold voltage after charges trapped in its floating gate. If the pass voltage of each lower cell is removed simultaneously, the channel voltage of the selected memory cell 802 will be pulled down to low level near ground. However, in the present embodiment, the pass voltage is sequentially removed from the bottom memory cell $M_0$, such that the channel voltage of the selected memory cell 802 can be retained since memory cells under the selected cell 802 with pass voltage ramping down are still turned on and the channel is supplied by the bit line voltage without interruption. Until pass voltage is removed from the programmed cell $M_N$, the programmed cell $M_N$ is turned off due to high threshold voltage but channel voltage of other cells are still kept high in preparation for a boost stage coming afterward.

Table 1 lists example voltage values for the embodiment shown in FIG. 10.

TABLE 1

| Parameter | Value |
|---|---|
| $V_{BL} = V_{cc}$ | 2.0 V |
| $V_{th\_SSL}$ (string select transistor) | 0.7 V |
| $V_{th}$ (upper memory cell) | −5.0 V |
| $V_{th}$ (cell M0~MN − 1) | −5.0 V |
| $V_{th}$ (cell MN) | 3.0 V |
| $V_1$ | 2.0 V |
| $V_2$ | 4.2 V |
| $V_{pass\_norm}$ | 7.0 V |
| $V_{pass\_0-N}$ | 7.0 V |
| $V_{prog}$ | 20.0 V |

With these values, the boosted voltage level for the NAND string is elevated to a higher state in order to inhibit the selected cell 802 more efficiently.

The methods and features of this invention have been sufficiently described in the above examples and descriptions. It should be understood that any modifications or changes without departing from the spirit of the invention are intended to be covered in the protection scope of the invention.

What is claimed is:

1. A method of programming a NAND flash memory cell, the method comprising:
    a pre-boost stage elevating a channel voltage of a selected memory cell; and a boost stage after the pre-boost stage, wherein the pre-boost stage comprises:
    biasing a bit line to a first voltage;
    biasing a string select transistor to a second voltage; and
    ramping down the string select transistor to the first voltage.

2. The method of claim 1, wherein the difference between the second voltage and the first voltage is greater than the threshold voltage of the string select transistor.

3. A method of programming a NAND flash memory cell string, the method comprising:
   a pre-boost stage arranged before a boost stage, wherein the pre-boost stage comprises:
   biasing a bit line to a first voltage;
   biasing a string select transistor to a second voltage;
   biasing all wordlines to a fourth voltage;
   ramping down the string select transistor to the first voltage; and
   ramping down wordlines to a low voltage.

4. The method of claim 3, wherein the difference between the second voltage and the first voltage is greater than the threshold voltage of the string select transistor.

5. The method of claim 3, wherein the low voltage is the initial voltage before the wordlines ramping up to the fourth voltage.

6. The method of claim 3, wherein the first voltage is $V_{cc}$.

7. A method of programming a NAND flash memory cell string, the method comprising:
   a pre-boost stage arranged before a boost stage, wherein the pre-boost stage comprises:
   biasing a bit line to a first voltage;
   biasing a string select transistor to a second voltage;
   biasing a lower cell to a fourth voltage, wherein the lower cell is further from the string select transistor than a selected memory cell;
   biasing an upper cell to a sixth voltage, wherein the upper cell is nearer to the string select transistor than the selected memory cell; and
   sequentially ramping down the bias on lower cell.

8. The method of claim 7, further biasing a plurality of lower cells to the fourth voltage.

9. The method of claim 8, wherein the sequence to ramp down the lower cells is in a consecutive order.

10. The method of claim 9, wherein the consecutive order is starting from the bottom cell and ending at the cell right under the selected cell.

11. The method of claim 8, wherein each lower cell can be ramped up to a different voltage.

12. The method of claim 7, wherein the fourth voltage and the sixth voltage can be the same.

13. The method of claim 7, wherein the difference between the second voltage and the first voltage is greater than the threshold voltage of the string select transistor.

14. The method of claim 7 further comprising ramping down the string select transistor to a lower voltage.

15. The method of claim 14, wherein the lower voltage is the first voltage.

16. The method of claim 7 further comprising ramping down the string select transistor to a lower voltage after sequentially ramping down the bias on the lower cells.

17. The method of claim 7, wherein the selected cell is biased in the pre-boost stage.

18. The method of claim 7, wherein biasing the lower cell to the fourth voltage is performed before biasing the bit line to the first voltage.

19. The method of claim 7, wherein biasing the upper cell to the sixth voltage is performed before biasing the bit line to the first voltage.

20. The method of claim 7, wherein the first voltage is $V_{cc}$.

* * * * *